US010386227B2

(12) United States Patent
Nakamura

(10) Patent No.: US 10,386,227 B2
(45) Date of Patent: Aug. 20, 2019

(54) PHOTOSENSOR HAVING A PRESSURE-WELDING PORTION TO PERFORM CONDUCTION WITH A CIRCUIT PORTION AND FIXING A PLURALITY OF CABLES

(71) Applicant: OMRON Corporation, Kyoto (JP)

(72) Inventor: Jumpei Nakamura, Kyoto (JP)

(73) Assignee: OMRON Corporation, Kyoto (JP)

( * ) Notice: Subject to any disclaimer, the term of this patent is extended or adjusted under 35 U.S.C. 154(b) by 175 days.

(21) Appl. No.: 15/726,391

(22) Filed: Oct. 6, 2017

(65) Prior Publication Data

US 2018/0209843 A1    Jul. 26, 2018

(30) Foreign Application Priority Data

Jan. 24, 2017  (JP) .................................. 2017-010235

(51) Int. Cl.
| | |
|---|---|
| *H01R 4/2425* | (2018.01) |
| *G01J 1/42* | (2006.01) |
| *G01J 1/02* | (2006.01) |
| *G01J 1/04* | (2006.01) |
| *G01J 1/08* | (2006.01) |

(Continued)

(52) U.S. Cl.
CPC .............. *G01J 1/42* (2013.01); *G01J 1/0271* (2013.01); *G01J 1/04* (2013.01); *G01J 1/08* (2013.01); *H01L 27/146* (2013.01); *H01L 31/02005* (2013.01); *H01L 31/167* (2013.01); *H01R 4/2425* (2013.01)

(58) Field of Classification Search
CPC .... G01J 1/0271; G01J 1/04; G01J 1/08; G01J 1/42; H01L 31/167; H01L 31/02005; H01R 4/2425

USPC ............................................. 250/239, 214 R
See application file for complete search history.

(56) References Cited

U.S. PATENT DOCUMENTS 5,076,801 A * 12/1991 Schroll ............... H01R 4/2441
                                                    439/404

FOREIGN PATENT DOCUMENTS

| CN | 203364859 | 12/2013 |
|---|---|---|
| CN | 104124284 | 10/2014 |

(Continued)

OTHER PUBLICATIONS

Office Action of China Counterpart Application, with English translation thereof, dated Mar. 1, 2019, pp. 1-11.

*Primary Examiner* — Que Tan Le
(74) *Attorney, Agent, or Firm* — JCIPRNET

(57) ABSTRACT

A photosensor of the present invention includes a circuit portion (34), a collective cable support portion (42), a pressure-welding portion (36a~36d) and a cable end support portion (46a~46d). The circuit portion (34) is configured to control the light projecting element and the light receiving element. The collective cable support portion (42) is configured to support a collective cable (10) including a plurality of cables (12a~12d). The pressure-welding portion (36a~36d) is configured to perform conduction with the circuit portion (34) by pressure-welding and fixing each of the plurality of cables (12a~12d). The cable end support portion (46a~46d) is configured to support an end of each of the plurality of cables (12a~12d). In each of the plurality of cables (12a~12d), a length from the pressure-welding portion (36a~36d) to the cable end support portion (46a~46d) is longer than that from the collective cable support portion (42) to the pressure-welding portion (36a~36d).

5 Claims, 2 Drawing Sheets

Figure 1:
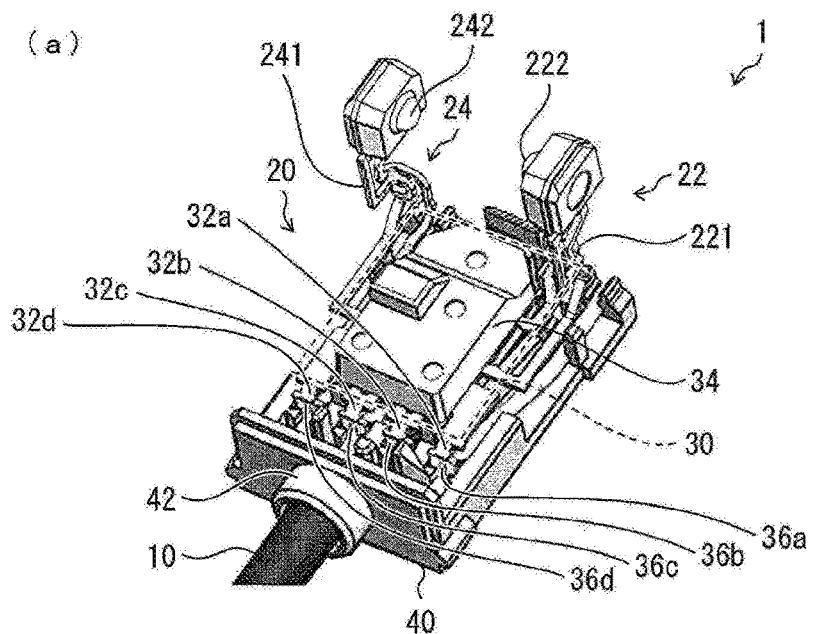
Figure 1:
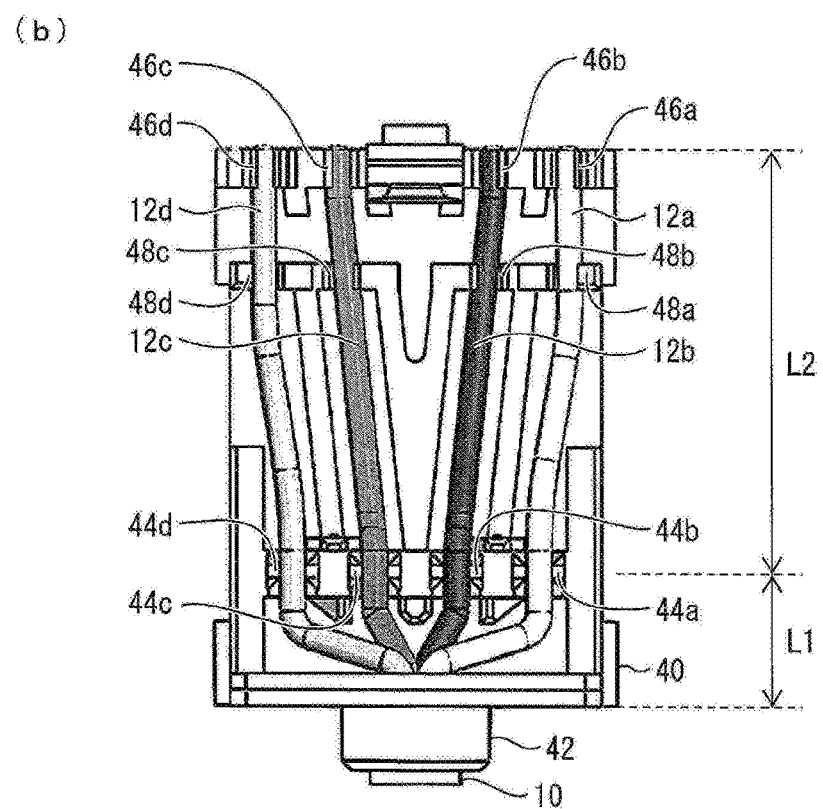

(51) Int. Cl.
  *H01L 27/146* (2006.01)
  *H01L 31/02* (2006.01)
  *H01L 31/167* (2006.01)

(56) References Cited

FOREIGN PATENT DOCUMENTS

| | | |
|---|---|---|
| CN | 104798213 | 7/2015 |
| JP | 2013251247 | 12/2013 |
| JP | 2014216422 | 11/2014 |

* cited by examiner (a)

(b)

PHOTOSENSOR HAVING A PRESSURE-WELDING PORTION TO PERFORM CONDUCTION WITH A CIRCUIT PORTION AND FIXING A PLURALITY OF CABLES

CROSS-REFERENCE TO RELATED APPLICATION

This application claims the priority benefit of Japanese application serial no. 2017-010235, filed on Jan. 24, 2017. The entirety of the above-mentioned patent application is hereby incorporated by reference herein and made a part of this specification.

BACKGROUND OF THE INVENTION

Field of the Invention

The invention relates to a photosensor.

Description of Related Art

A circuit portion of a photosensor and a cable for transmitting and receiving a signal and electric power to/from the corresponding circuit portion are mainly connected to each other by solder connection.

On the other hand, there is proposed a technique in which the circuit portion and the cable are connected by pressure-welding to reduce the number of manufacturing processes as compared with a connection by the solder connection (Patent Document 1).

PRIOR ART DOCUMENT

Patent Documents

[Patent Document 1] Japanese Unexamined Patent Application Publication No. 2014-216422 (published on Nov. 17, 2014)

SUMMARY OF THE INVENTION

For example, the photosensor is used in a factory line to position a filling operation of a bottle. However, in the photosensor in which the circuit portion and the cable are connected by the pressure-welding as described above, there is a problem that the cable tends to be easily separated from the circuit portion in an environment in which surroundings of the factory line or the like vibrate.

The inventor discovered that when an end surface of the cable is supported by the photosensor but a distance between the end surface of the cable and a place to which the cable is pressure-welded is short, it can contribute to separation of the cable from the photosensor.

One aspect of the present invention is to realize a photosensor in which a distance between an end surface of a cable and a place to which the cable is pressure-welded is increased and the cable is less likely to be separated from a circuit portion.

To solve the above problem, a photosensor according to one aspect of the present invention is a photosensor which includes a light projecting element and a light receiving element, including a circuit portion configured to control the light projecting element and the light receiving element, a collective cable support portion configured to support a collective cable including a plurality of cables, a pressure-welding portion configured to perform conduction with the circuit portion by pressure-welding and fixing each of the plurality of cables, and a cable end support portion configured to support an end of each of the plurality of cables, wherein, in each of the plurality of cables, a length from the pressure-welding portion to the cable end support portion is longer than that from the collective cable support portion to the pressure-welding portion.

According to the above-described constitution, since the length of the cable from the pressure-welding portion to the cable end support portion is formed to be long, the vibration can be absorbed at this length portion. Therefore, even when the collective cable is pulled and is receiving vibration, it is possible to reduce the risk of separating the cable from the pressure-welding portion. Accordingly, since it is possible to maintain stable quality even in an environment in which vibration is generated, it is possible to provide a photosensor which can be used in various environments.

Also, since the conduction with the circuit portion is performed by pressure-welding and fixing each of the cables, it is possible to reduce the number of processing processes as compared with the connection by solder connection. That is, it is possible to realize both reduction in manufacturing cost and improvement in reliability.

In the photosensor according to one aspect of the present invention, the light projecting element and the light receiving element may be disposed to face each other.

According to the above-described constitution, it is possible to provide a facing type photosensor having stable quality.

In the photosensor according to one aspect of the present invention, a light projecting support portion configured to support the light projecting element, a light receiving support portion configured to support the light receiving element, and a connection portion configured to connect one end of the light projecting support portion with one end of the light receiving support portion may be further included, and the circuit portion may be provided at the connection portion.

According to the above-described constitution, since the circuit portion is provided at the connection portion which connects one end of the light projecting support portion with one end of the light receiving support portion, the photosensor can be realized with a compact structure. That is, in addition to the reduction in the manufacturing cost and the improvement in reliability, it is possible to provide a highly versatile photosensor having a small device size.

In the photosensor according to one aspect of the present invention, a cable intermediate support portion which supports the cable may be further provided between the cable end support portion and the pressure-welding portion.

According to the above-described constitution, it is possible to stabilize an arrangement position of a portion of the cable of which a length is long between the cable end support portion and the pressure-welding portion. Therefore, at the time of assembly, a smooth operation can be realized by preventing entanglement of adjacent cables or the like.

Further, when vibration is applied, it is possible to prevent unnecessary vibration of the cables between the cable end supporting portion and the pressure-welding portion and thus to prevent the cables from being separated from the pressure-welding portion.

In the photosensor according to one aspect of the present invention, the connection portion may be disposed in a direction perpendicular to a surface forming a wiring region in which the plurality of cables are disposed between the pressure-welding portion and the cable end support portion, and in a direction from the pressure-welding portion toward the cable end support portion as seen from the direction perpendicular to the surface forming the wiring region, a length from the pressure-welding portion to the cable end support portion may be longer than a length of the connection portion.

According to the above-described constitution, the length of the cable from the pressure-welding portion to the cable end support portion is longer than that of the connection portion. Therefore, the length of the cable from the pressure-welding portion to the cable end support portion can be secured to be relatively long without increasing a sensor size in the structure of the photosensor. That is, since an absorption effect of vibration can be exhibited more effectively, the reliability can be enhanced.

Further, by providing the connecting portion in which the circuit portion is provided to overlap a surface on which the wiring region where the plurality of cables are arranged is formed, application of electrostatic noise to the circuit portion can be suppressed by a shield effect due to the wiring region.

According to one aspect of the present invention, it is possible to reduce the risk of the cable being separated from the pressure-welding portion of the photosensor.

BRIEF DESCRIPTION OF THE DRAWINGS (a) of FIG. 1 is a perspective view of a photosensor according to an embodiment of the present invention, and (b) of FIG. 1 is a top view of the photosensor according to the embodiment of the present invention.

Figure 2:
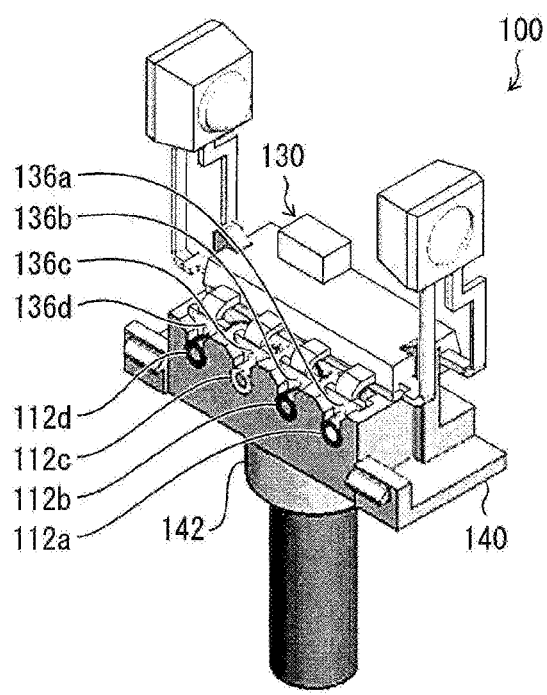
Figure 2:
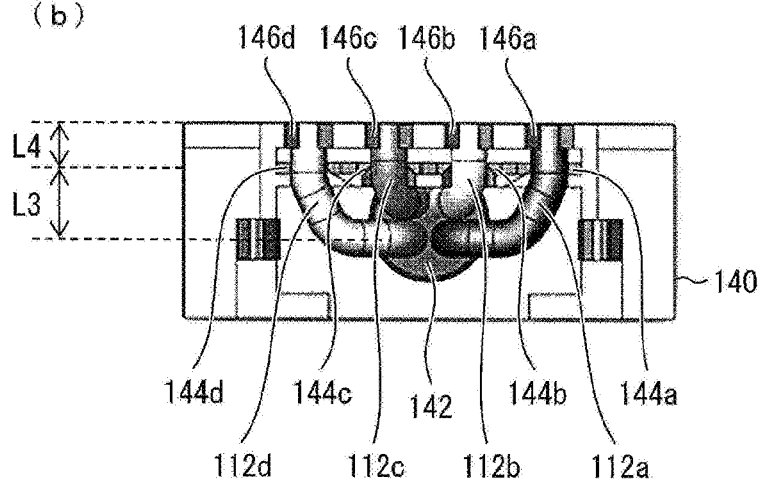

(a) of FIG. 2 is a perspective view of a photosensor of a comparative example, and (b) of FIG. 2 is a top view of the photosensor of the comparative example.

DESCRIPTION OF THE EMBODIMENTS (a) of FIG. 1 is a perspective view of a photosensor 1 according to an embodiment of the present invention, and (b) of FIG. 1 is a top view of the photosensor 1 according to the embodiment of the present excluding a sensor circuit assembly 20. The photosensor 1 includes a collective cable 10, a sensor circuit assembly 20 and a holder 40.

The collective cable 10 includes a plurality of cables 12a to 12d and an outer casing which covers the plurality of cables 12a to 12d.

The sensor circuit assembly 20 includes a light projecting portion 22, a light receiving portion 24 and a connection portion 30. The light projecting portion 22, the light receiving portion 24 and the connection portion 30 are integrated.

The light projecting portion 22 includes a light projecting support portion 221, a light projection lens 222 and a light projecting element. The light projecting support portion 221 includes a part of a lead frame. The light projecting element is mounted on the lead frame, is supported by the light projecting support portion 221 and is covered with the light projecting lens 222. The light projecting element is, for example, a light emitting diode.

The light receiving portion 24 includes a light receiving support portion 241, a light receiving lens 242 and a light receiving element. The light receiving support portion 241 includes a part of the lead frame. The light receiving element is mounted on the lead frame, is supported by the light receiving support portion 241 and is covered with the light receiving lens 242. The light receiving element is, for example, a phototransistor.

In the embodiment, the light projecting element and the light receiving element are disposed to face each other.

The connection portion 30 connects one end of the light projecting support portion 221 with one end of the light receiving support portion 241. The connection portion 30 includes a part of the lead frame and connection terminals 32a to 32d, and a circuit portion 34 is provided. Since the circuit portion 34 is provided at the connection portion 30 which connects one end of the light projecting support portion 221 with one end of the light receiving support portion 241, the photosensor 1 can be realized with a compact structure. That is, the photosensor 1 has a small device size and high versatility.

The circuit portion 34 is mounted on the lead frame. The circuit portion 34 is connected to the light projecting element and the light receiving element through the lead frame. The circuit portion 34 controls light emission of the light projecting element. Further, the circuit portion 34 determines presence or absence of light reception by the light receiving element and controls a signal which is output according to the determination result.

One end of the connection terminals 32a to 32d is integrated with a part of the lead frame of which one end is included in the connection portion 30. The connection terminals 32a to 32d are connected to the circuit portion 34.

The connection terminals 32a to 32d include pressure-welding portions 36a to 36d for pressure-welding the corresponding cables 12a to 12d at the other end portions.

The pressure-welding portions 36a to 36d perform conduction between the cables 12a to 12d and the circuit portion 34 by pressure-welding and fixing the cables 12a to 12d.

The holder 40 supports the cables 12a to 12d and the sensor circuit assembly 20.

A collective cable support portion 42, pressure-welding support portions 44a to 44d, cable end support portions 46a to 46d and cable intermediate support portions 48a to 48d are formed at the holder 40.

An outer sheath of a portion of the collective cable 10 which is supported by the holder 40 is peeled off, and the holder 40 supports the cables 12a to 12d.

The collective cable support portion 42 is provided on one end surface of the holder 40. The collective cable support portion 42 supports the collective cable 10 at a base of a portion in which the outer sheath of the collective cable 10 is peeled off.

The pressure-welding support portions 44a to 44d are provided at places corresponding to the pressure-welding portions 36a to 36d. The pressure-welding support portions 44a to 44d protrude from the holder 40 and have U-shaped grooves. Each of the cables 12a to 12d is supported by the U-shaped groove of the corresponding pressure-welding support portion 44a to 44d.

The cable end support portions 46a to 46d have U-shaped grooves formed on the other end surface of the holder 40. Ends of the cables 12a to 12d are press-fitted into the U-shaped grooves and are supported by the cable end support portions 46a to 46d.

The cable intermediate support portions 48a to 48d are provided between the pressure-welding portions 36a to 36d and the cable end support portions 46a to 46d. The cable intermediate support portions 48a to 48d protrude from the holder 40 and have U-shaped grooves. Each of the cables 12a to 12d is supported by the U-shaped groove of the corresponding cable intermediate support portion 48a to 48d.

By providing the cable intermediate support portions 48a to 48d, it is possible to stabilize arrangement positions of the portions of the cables 12a to 12d in which lengths of the cables 12a to 12d are long between the cable end support portions 46a to 46d and the pressure-welding portions 36a to 36d. Therefore, at the time of assembly, it is possible to prevent entanglement between the adjacent cables 12a to 12d, thereby realizing a smooth operation.

Further, when vibration is applied to the photosensor 1, the cables 12a to 12d between the cable end support portions 46a to 46d and the pressure-welding portions 36a to 36d are prevented from vibrating more than necessary and thus prevented from being separated from the pressure-welding portions 36a to 36d.

A region of the holder 40 in which the cables 12a to 12d between the pressure-welding portions 36a to 36d and the cable end support portions 46a to 46d are disposed is referred to as a wiring region. The connection portion 30 is disposed in a direction perpendicular to a surface on which the wiring region is formed.

Due to such an arrangement, in a lengthwise direction from the pressure-welding portions 36a to 36d toward the cable end support portions 46a to 46d as seen from a direction perpendicular to a surface of the wiring region, the cables 12a to 12d can be disposed with a length corresponding to at least a length of the connection portion 30. A length L2 from the pressure-welding portions 36a to 36d to the cable end support portions 46a to 46d is longer than the length of the connection portion 30 in the lengthwise direction.

Further, as illustrated in FIG. 1A, in each of the cables 12a to 12d, the length L2 in the lengthwise direction from the pressure-welding portions 36a to 36d to the cable end support portions 46a to 46d is longer than a length L1 in the lengthwise direction from the collective cable support portion 42 to the pressure-welding portions 36a to 36d. Since the length L2 from the pressure-welding portions 36a to 36d to the cable end support portions 46a to 46d is long, the vibration can be absorbed in this length portion. Therefore, it is possible to reduce the risk of separation of the cables 12a to 12d from the pressure-welding portions 36a to 36d even when the collective cable 10 is pulled and vibrated. Accordingly, since the photosensor 1 of the embodiment can maintain stable quality even in an environment in which vibration is generated, it can be used in various environments.

Further, since the conduction between each of the cables 12a to 12d and the circuit portion 34 is carried out by pressure-welding and fixing each of the cables 12a to 12d, it is possible to reduce the number of processing processes as compared with the connection by the solder connection. That is, it is possible to realize both reduction in of manufacturing cost and improvement in reliability.

In addition, the connection portion 30 in which the circuit portion 34 is provided is disposed to overlap the surface on which the wiring region where the plurality of cables 12a to 12d are disposed is formed. Therefore, application of electrostatic noise to the circuit portion 34 can be suppressed by a shield effect due to the wiring region.

Comparative Example (a) of FIG. 2 is a perspective view of a photosensor 100 of a comparative example. Further, (b) of FIG. 2 is a top view of the photosensor 100 of the comparative example.

Further, for convenience of explanation, explanation of members having the same functions as those of the members described in the above embodiment will be omitted.

In the photosensor 100 of the comparative example, cables 112a to 112d are vertically bent in a collective cable supporting portion 142.

The cables 112a to 112d are pressure-welded to pressure-welding portions 136a to 136d at pressure-welding support portions 144a to 144d. Ends of the cables 112a to 112d are supported by cable end support portions 146a to 146d.

A region of the holder 140 in which the cables 112a to 112d between the pressure-welding portions 136a to 136d and the cable end support portions 146a to 146d are disposed is referred to as a wiring region. In the photosensor 100 of the comparative example, a region in which the wiring region is formed and a region in which the connection portion 130 is disposed do not overlap each other.

Due to such an arrangement, in a lengthwise direction from the pressure-welding portions 136a to 136d toward the cable end support portions 146a to 146d as seen from a direction perpendicular to the surface of the wiring area, a length L4 in the lengthwise direction from the pressure-welding portions 136a to 136d to the cabinet end support portions 146a to 146d is shorter than a length L3 in the lengthwise direction from the collective cable support portion 142 to the pressure-welding portions 136a to 136d. In the constitution in which the length L4 in the lengthwise direction from the pressure-welding portions 136a to 136d to the cable end support portions 146a to 146d is short, the cables 112a to 112d are easily separated from the circuit portion as compared with the constitution of the embodiment.

Modified Example

In the form in which the connection portion is disposed in the region where the cable between the press contact portion and the cable end portion support portion is disposed as in the photosensor 1 according to the embodiment, the cable may be vertically bent at the collective cable support portion, like the photosensor 100 of the comparative example.

Even in such a constitution, the cable can be disposed with a length which is secured to correspond to at least the length of the connection portion. Therefore, it is difficult for the cable to be separated from the circuit section of the photosensor, and a highly reliable photosensor is realized.

Further, the light projecting element and the light receiving element do not have to be disposed to face each other. A reflection type photosensor in which the light projecting element and the light receiving element are disposed side by side and projected light is reflected by a reflecting surface and is then received may be used.

The present invention is not limited to the above-described embodiments, but various modifications are possible within the scope indicated in the claims, and embodiments obtained by appropriately combining technical means disclosed in different embodiments are also included in the technical scope of the present invention.

What is claimed is:

1. A photosensor which comprises a light projecting element and a light receiving element, comprising:
a circuit portion configured to control the light projecting element and the light receiving element,
a collective cable support portion configured to support a collective cable including a plurality of cables,
a pressure-welding portion configured to perform conduction with the circuit portion by pressure-welding and fixing each of the plurality of cables, and
a cable end support portion configured to support an end of each of the plurality of cables, wherein, in each of the plurality of cables, a length from the pressure-welding portion to the cable end support portion is longer than that from the collective cable support portion to the pressure-welding portion.

2. The photosensor according to claim 1, wherein the light projecting element and the light receiving element are disposed to face each other.

3. The photosensor according to claim 1, further comprising a light projecting support portion configured to support the light projecting element, a light receiving support portion configured to support the light receiving element, and a connection portion configured to connect one end of the light projecting support portion with one end of the light receiving support portion, wherein the circuit portion is provided at the connection portion.

4. The photosensor according to claim 1, wherein a cable intermediate support portion which supports the cable is further provided between the cable end support portion and the pressure-welding portion.

5. The photosensor according to claim 3, wherein the connection portion is disposed in a direction perpendicular to a surface forming a wiring region in which the plurality of cables are disposed between the pressure-welding portion and the cable end support portion, and in a direction from the pressure-welding portion toward the cable end support portion as seen from the direction perpendicular to the surface forming the wiring region, a length from the pressure-welding portion to the cable end support portion is longer than a length of the connection portion.

* * * * *